(12) United States Patent
Takasou et al.

(10) Patent No.: US 7,414,300 B2
(45) Date of Patent: Aug. 19, 2008

(54) MOLDED SEMICONDUCTOR PACKAGE

(75) Inventors: Jun Takasou, Tokyo (JP); Katsumi Miyawaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 46 days.

(21) Appl. No.: 11/387,700

(22) Filed: Mar. 24, 2006

(65) Prior Publication Data

US 2007/0069343 A1 Mar. 29, 2007

(30) Foreign Application Priority Data

Sep. 26, 2005 (JP) ............................ 2005-278308

(51) Int. Cl.
*H01L 23/495* (2006.01)
(52) U.S. Cl. ...................... 257/666; 257/676
(58) Field of Classification Search ................ 257/666, 257/676, 672
See application file for complete search history.

(56) References Cited

U.S. PATENT DOCUMENTS

| | | | |
|---|---|---|---|
| 4,982,268 A * | 1/1991 | Schuermann | 257/666 |
| 5,168,368 A | 12/1992 | Gow, 3rd et al. | |
| 5,327,009 A * | 7/1994 | Igeta | 257/666 |
| 6,940,154 B2 * | 9/2005 | Pedron et al. | 257/666 |
| 7,230,322 B2 * | 6/2007 | Funato et al. | 257/666 |
| 2005/0236698 A1 * | 10/2005 | Ozawa et al. | 257/666 |

FOREIGN PATENT DOCUMENTS

| | | |
|---|---|---|
| JP | 49-50878 | 5/1974 |
| JP | 5-152503 A | 6/1993 |
| JP | 6-29341 | 2/1994 |
| JP | 7-240494 | 9/1995 |
| JP | 8-70090 | 3/1996 |
| JP | 2000-77600 A | 3/2000 |
| JP | 2000-196004 | 7/2000 |
| JP | 2003-163311 | 6/2003 |
| JP | 2003-297996 | 10/2003 |
| JP | 2004-221482 A | 8/2004 |

* cited by examiner

*Primary Examiner*—S. V Clark
(74) *Attorney, Agent, or Firm*—Leydig, Voit & Mayer, Ltd.

(57) ABSTRACT

A molded semiconductor package has a lead frame to which an LSI is bonded, inner lead frames located on opposing sides of the lead frame, and wires. Each wire is connected between the LSI and a corresponding one of the inner lead frames. A distance between an edge of the lead frame (or an edge of the molded semiconductor package) and an end of inner lead frame is larger than a distance between another edge of the lead frame (or another edge of the molded semiconductor package) and an edge of an inner lead frame to minimize the length of wires connected to the lead frame.

19 Claims, 7 Drawing Sheets z-axis-direction

MOLDED SEMICONDUCTOR PACKAGE

BACKGROUND OF THE INVENTION

1. Field of the Invention

The present invention relates to a molded semiconductor package, and more particularly to a lead frame configuration of a molded semiconductor package.

2. Background Art

Generally, an increase in the operational frequency of a semiconductor device leads to an increase in the inductive components of wires connected between an LSI and a lead frame. On the other hand, an increase in the pin count of a package leads to an increase in the package size, and an increase in the package size results in an increase in the length of the wires connected between the LSI and the lead frame. The increase in the length of the lead frame increases the inductive components of the wires, resulting in degraded high frequency characteristics. In order to reduce the loss components of the wires, conventional molded semiconductor packages are constructed such that: the chip is disposed near the lead frame so as to reduce the length of selected wires; or an intermediate wiring substrate is provided to reduce the length of wires. With these conventional techniques, however, wires other than the selected wires still have a large length. Furthermore, incorporating an intermediate wiring substrate, etc. requires the package to be reconfigured. As a result, it is difficult to manufacture a package having a simple configuration at low cost.

On the other hand, one known method for reducing the inductive components of the wires without reducing their length is to use two wires for each connection to halve the effective inductance. However, this technique requires additional pads to be provided on the LSI and the inner lead frames, since, as described above, it uses two wires for each connection, resulting in an increase in the size of the LSI and the package.

In the case of high frequency LSI, the inductive components of the wires are a factor in waveform degradation. (That is, the inductive components of the wires cause the frequency band of the circuit to be degraded, which leads to Tr/Tf degradation and hence increased jitter, resulting in degradation in the waveform.) Therefore, the length of the wires for high frequency terminals must be reduced as much as possible. Some conventional methods reduce the inductive components of the wires by minimizing their length. See, for example, Japanese Patent Laid-open No. Hei 7-240494 (hereinafter referred to as Patent document 1), No. Hei 8-70090 (hereinafter referred to as Patent document 2) and No. Hei 6-29341 (hereinafter referred to as Patent document 3).

As the number of functions of semiconductor packages has increased, so has the number of pads in these packages, resulting in increased chip size. This is in contradiction to the need to reduce the size of the package so as to be able to mount it in a small space. Overcoming this problem requires a lead frame or inner lead frames that allow even a large chip to be wired in a small package. (That is, the wires must be densely arranged.) Such a lead frame is disclosed in Japanese Patent Laid-open No. 2003-297996 (hereinafter referred to as Patent document 4).

Each high frequency analog chip employs two types of terminals: those requiring that the length of the wires connected to them be reduced to reduce their inductive components; and those requiring that the length of the wires connected to them be increased in order to utilize their inductive components. To achieve such an arrangement, the lead frame must be adapted to allow the length of the wire for each terminal to be appropriately adjusted. To adjust the wire length, one of such lead frames includes a metal portion which is used to increase the area within which the wires from the semiconductor chip are bonded. See, for example, Patent document 1.

Further, there has been a need for a common package having the same configuration (footprint) as conventional packages and capable of accommodating any chip, in order to facilitate packaging and reduce package cost. See, for example, Japanese Patent Laid-open No. 2000-196004 (hereinafter referred to as Patent document 5).

Further, there is also a need for a molded package in which wires having high frequency loss components have been eliminated to meet higher frequency requirements. See, for example, Patent document 1.

Specifically, the technique disclosed in the above Patent document 1 directly bonds a lead to the die pad to reduce the wire length. This technique is disadvantageous in that it can be applied only to this particular lead (for a ground signal). As for the technique disclosed in the above Patent document 2, it reduces the length of the wires for particular pads (or nodes) by using a peripheral wiring region lead frame. This technique can be applied to pads (or pins) disposed at the four corners but cannot be effectively applied to signal lead frames which require that the length of the wires connected to them be reduced to reduce the inductive components. The pads, or nodes, at the four corners are usually used for DC signals such as ground signals and power supply signals. Further problem with this technique is that the length of the wires extending from the lead frame must be increased to accommodate the peripheral wiring region lead frame. The technique described in the above Patent document 3 employs a configuration including two different types of lead frames; a first set of fingers, a second set of fingers. The second set of fingers is provided with a bridge 24. In the above technique, the length of wires is reduced as short as being able to solve the problem of "wire sweep" or "wire wash". However, the bridge 24 is a necessary component of the configuration in the technique of the Patent document 3.

Further, although the technique described in the above Patent document 4 allows wires to be densely arranged, these wires must have a large length.

Further, according to the above Patent document 1, in order to adjust the wire length, a metal portion is provided to increase the area within which wires from the semiconductor chip are bonded. However, since the metal portion is added to the lead frame and the lead, this technique is disadvantageous in that it can be applied only a single node (for a ground signal).

Further, the technique disclosed in the above Patent document 5 provides a lead frame in which each lead has a few internal connection terminal lands so as to be able to accommodate chips having different sizes. That is, a plurality of peripheral node pad in the lead frame can accommodate each of the different size of chips at the same position. Thus, this technique helps provide a common package but has a problem in that a complicated pattern similar to a conductive lead pattern must be formed on the back surface, since each lead has a plurality of terminal lands.

Further, as described above, there is a need for a molded package in which wires having high frequency loss components have been eliminated to meet higher frequency requirements. However, the technique of Patent document 1 is disadvantageous in that the total length of wires is reduced.

SUMMARY OF THE INVENTION

An object of the present invention is to solve the above problems. According to one aspect of the present invention, a molded semiconductor package comprises a lead frame, a plurality of inner lead frames formed on opposing sides of the edge of said lead frame, and wires. A semiconductor chip is bonded to said lead frame. Each connecting member is connected between said semiconductor chip and a corresponding one of said inner lead frames. A distance between an edge of the lead frame (or an edge of the molded semiconductor package) and an end of an inner lead frame is larger than a distance between another edge of the lead frame (or another edge of the molded semiconductor package) and an end of another inner lead frame so as to minimize the length of wires connected to the inner lead frame.

The inner lead frame is a closest one of said inner lead frames to a side of said semiconductor chip connected with the side by means of one of said connecting members. The another inner lead frame is closest one of said inner lead frames to another side of said semiconductor chip connected with the another side by means of another one of said connecting members.

The edge of the lead frame corresponds the side of said semiconductor chip, and the another edge corresponds the another side of said semiconductor chip.

Other and further objects, features and advantages of the invention will appear more fully from the following description.

DETAILED DESCRIPTION OF THE PREFERRED EMBODIMENTS

A preferred embodiment of the present invention will now be described with reference to FIGS. 1 to 23.

First Embodiment

Figure 1:
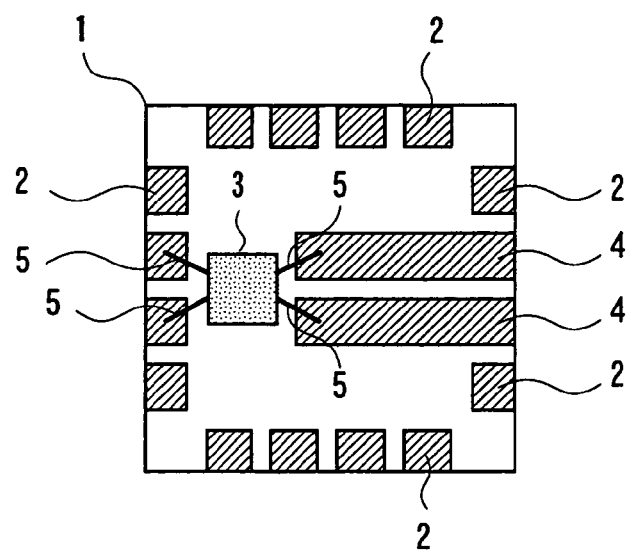
FIG. 1 is a layout diagram of a molded semiconductor package according to a first embodiment of the present invention, as viewed from the top surface.

FIG. 1 is a layout diagram of a molded semiconductor package according to a first embodiment of the present invention, showing a lead frame, wires, and a mounted LSI as viewed from the top surface.

Referring to the figure, reference numeral 1 denotes the lead frame; 2, inner lead frames; 3, the LSI (or semiconductor chip); 4, inner lead frames extended into close proximity to the LSI 3; and 5, wires connected between the LSI 3 and the inner lead frames 2 and 4. When the LSI 3 is disposed on the left-hand side of the package (as shown in FIG. 1), the LSI 3 is closer to the left edge of the lead frame 1 than to the right edge and hence the wires 5 connected between the LSI 3 and the inner lead frames on the left side have a short length. On the other side (right-hand side in the FIG. 1) of the package, the inner lead frames 4 are extended from a edge of the lead frame 1 into close proximity to a side of the semiconductor chip to reduce the distance between the LSI 3 or the chip and the inner lead frames 4 and thereby reduce the length of the wires 5 on the right side as shown in FIG. 1.

Figure 2:
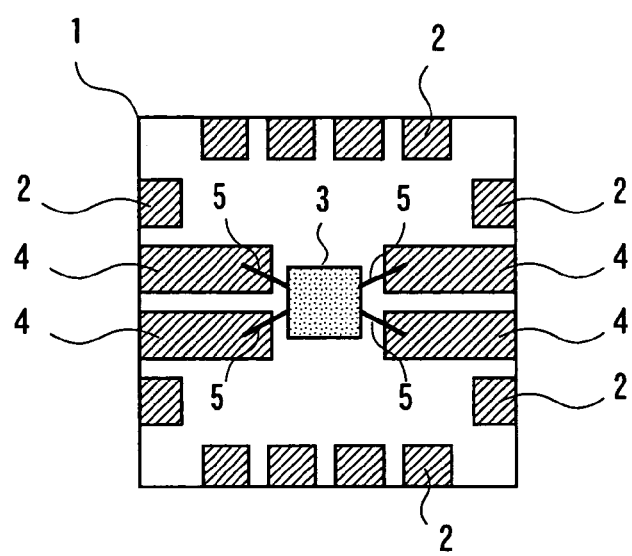
FIG. 2 is a layout diagram of a molded semiconductor package according to the first embodiment, as viewed from the top surface.

FIG. 2 is a layout diagram of another molded semiconductor package, showing a lead frame, wires, and a mounted LSI as viewed from the top surface.

Whereas in FIG. 1 the LSI is disposed on the left-hand side of the package, in FIG. 2 the LSI is disposed at the center of the package. Specifically, in this example, the LSI is disposed at the center of the package, and inner lead frames 4 on the both sides (on the left side and the right side or the package as viewed in FIG. 2) are extended to reduce the length of the wires 5 as shown in FIG. 2.

In FIG. 2, as in FIG. 1, reference numeral 1 denotes the lead frame; 2, inner lead frames; 3, the LSI; 4, the inner lead frames extended into close proximity to the LSI 3; and 5, wires connected between the LSI 3 and the inner lead frames 2 and 4.

Figure 3:
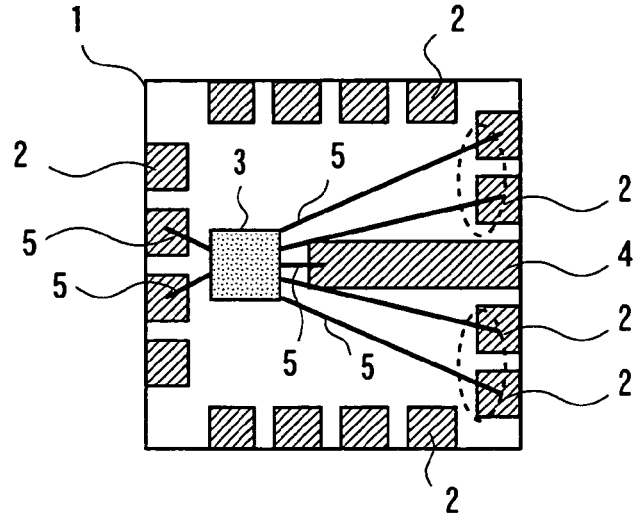
FIG. 3 is a layout diagram of a molded semiconductor package according to the first embodiment, as viewed from the top surface.

FIG. 3 is a layout diagram of still another molded semiconductor package, showing a lead frame, wires, and a mounted LSI as viewed from the top surface.

Whereas in FIGS. 1 and 2 a pair or pairs of inner lead frames 4 are extended into close proximity to the LSI for a differential signal (in a differential mode), in FIG. 3 only one of the inner lead frames 4 is extended.

In FIG. 3, as in FIG. 1, reference numeral 1 denotes the lead frame; 2, inner lead frames; 3, the LSI; 4, the inner lead frame extended into close proximity to the LSI 3; and 5, wires connected between the inner lead frames 2 and 4.

Figure 4:
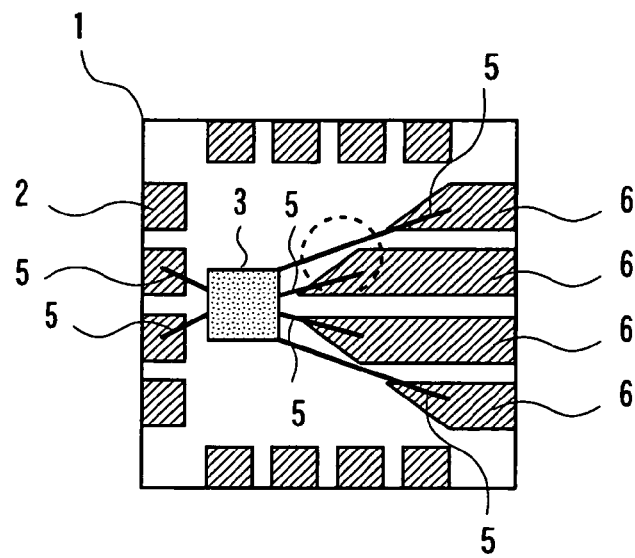
FIG. 4 is a layout diagram of a molded semiconductor package according to the first embodiment, as viewed from the top surface.

FIG. 4 is a layout diagram of still another molded semiconductor package, showing a lead frame, wires, and a mounted LSI as viewed from the top surface.

In FIG. 4, as in FIG. 1, reference numeral 1 denotes the lead frame; 2, inner lead frames; 3, the LSI; and 5, wires connected between the LSI 3 and inner lead frames 2. Reference numeral 6 denotes inner lead frames extended into close proximity to the LSI 3 and having a chamfered leading end (indicated by a broken line circle in FIG. 4).

Figure 5:
FIG. 5 is a top view showing an exemplary inner lead frame having a chamfered leading end according to the first embodiment.

FIG. 5 is a top view showing an exemplary inner lead frame having a chamfered leading end.

In FIG. 5, reference numeral 7 denotes the inner lead frame, in which the leading end is chamfered at an acute angle to produce a pointed tip.

Figure 6:
FIG. 6 is a top view showing an exemplary inner lead frame having a chamfered leading end according to the first embodiment.

FIG. 6 is a top view showing another exemplary inner lead frame having a chamfered leading end.

In FIG. 6, reference numeral 8 denotes the inner lead frame, in which only a portion of the leading end is chamfered, leaving an unchamfered flat surface at the tip.

Figure 7:
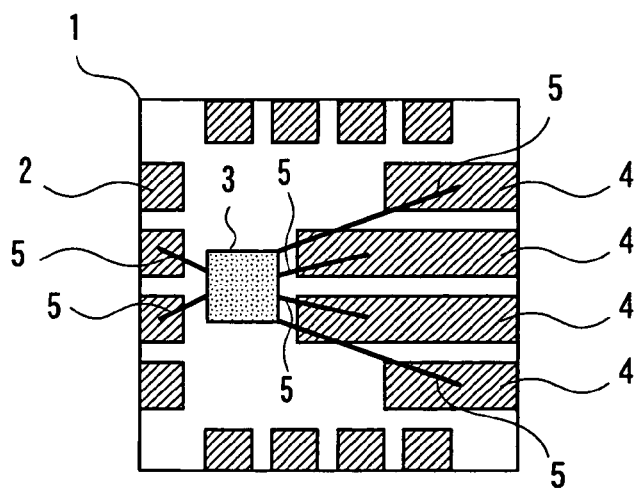
FIG. 7 is a layout diagram of a molded semiconductor package according to the first embodiment.

FIG. 7 is a layout diagram of still another semiconductor package, in which unchamfered inner lead frames are extended into close proximity to the LSI.

In FIG. 7, reference numeral 1 denotes a lead frame; 2, inner lead frames; 3, the LSI; 4, the inner lead frames extended into close proximity to the LSI 3, being closer than the other inner lead frames; and 5, wires connected between the LSI 3 and the inner lead frames 4.

Figure 8:
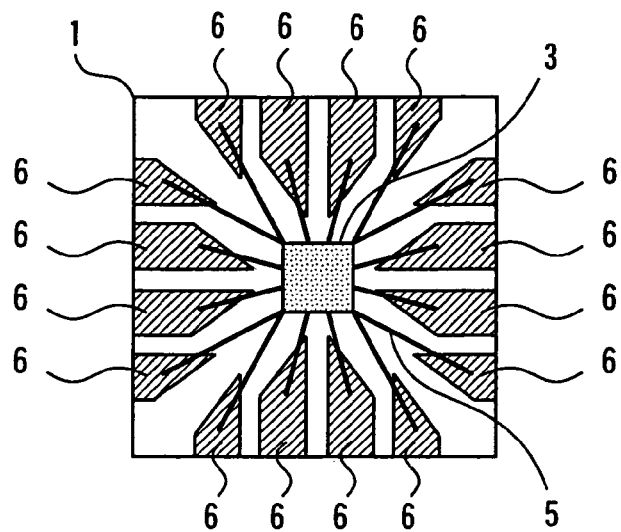
FIG. 8 is a layout diagram of a molded semiconductor package according to the first embodiment, in which the inner lead frames on all four sides are extended into close proximity to the LSI.

FIG. 8 is a layout diagram of still another molded semiconductor package, in which the inner lead frames on all four sides are extended into close proximity to the LSI to reduce the length of the wires connected to them.

In FIG. 8, reference numeral 1 denotes a lead frame; 3, the LSI; 5, wires connected between the LSI 3 and the inner lead frames on the four sides; and 6, the inner lead frames on the four sides extended into close proximity to the LSI 3.

Figure 9:
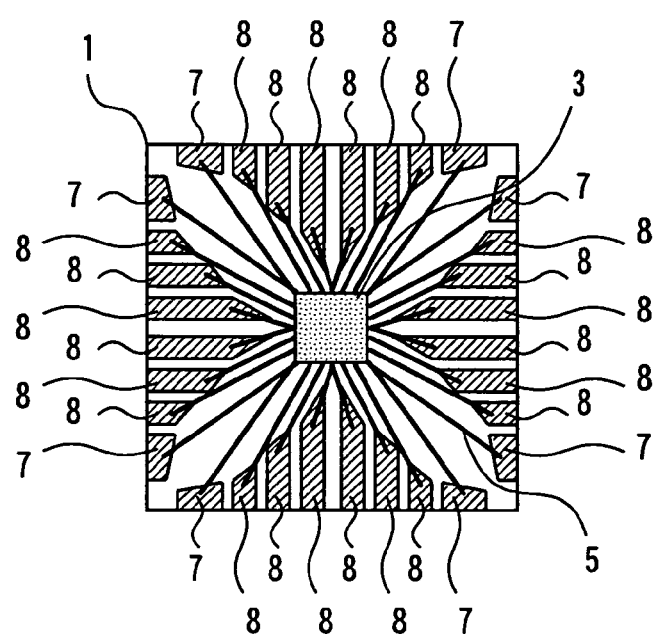
FIG. 9 is a layout diagram of a molded semiconductor package according to the first embodiment, in which particular inner lead frames have a smaller width than other inner lead frames.

FIG. 9 is a layout diagram of still another molded semiconductor package, in which the width of particular inner lead frames have a smaller width than other inner lead frames to allow the wires to be densely arranged.

In FIG. 9, reference numeral 1 denotes a lead frame; 3, an LSI; 5, wires connected between the LSI 3 and inner lead frames; 7, inner lead frames disposed at the four corners and having a larger width than the other inner lead frames 8 disposed along the sides of the lead frame; and, 8, the inner lead frames having a thinner width than the inner lead frames 7 at the four corners.

Figure 10:
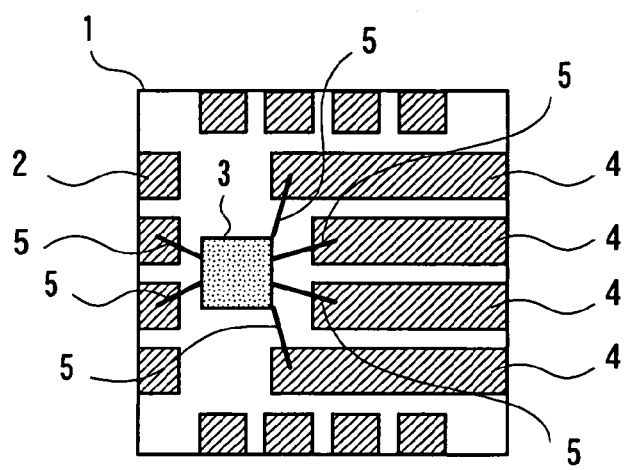
FIG. 10 is a layout diagram of a molded semiconductor package according to the first embodiment, having a configuration that allows the length of the wires extended from the four corners of the LSI to be reduced.

FIG. 10 is a layout diagram of still another molded semiconductor package having a configuration that allows the length of wires extended from the four corners of the LSI to be reduced.

In FIG. 10, reference numeral 1 denotes a lead frame; 2, inner lead frames; 3, the LSI; 4, inner lead frames extended into closer proximity to the LSI 3 than other inner lead frames; and 5, wires connected between the LSI 3 and the inner lead frames 2 and 4.

Figure 11:
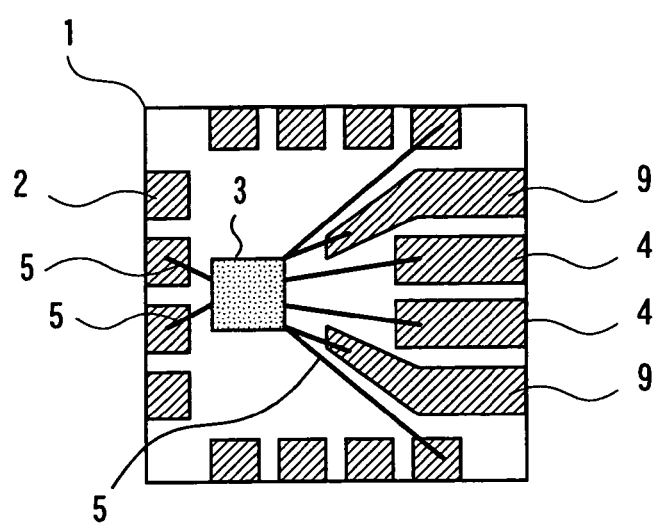
FIG. 11 is a layout diagram of a molded semiconductor package according to the first embodiment, having a configuration that allows the length of the wires extended from the four corners of the LSI to be further reduced, as compared to the example shown in FIG. 10.

FIG. 11 is a layout diagram of still another molded semiconductor package having a configuration that allows the length of the wires extended from the four corners of the LSI to be further reduced, as compared to the example shown in FIG. 10.

In FIG. 11, reference numeral 1 denotes a lead frame; 2, inner lead frames; 3, the LSI; 4, inner lead frames extended into closer proximity to the LSI 3 than other inner lead frames; 5, wires connected between the LSI 3 and the inner lead frames 2 and 4; and 9, arch-shaped curved inner lead frames.

Figure 12:
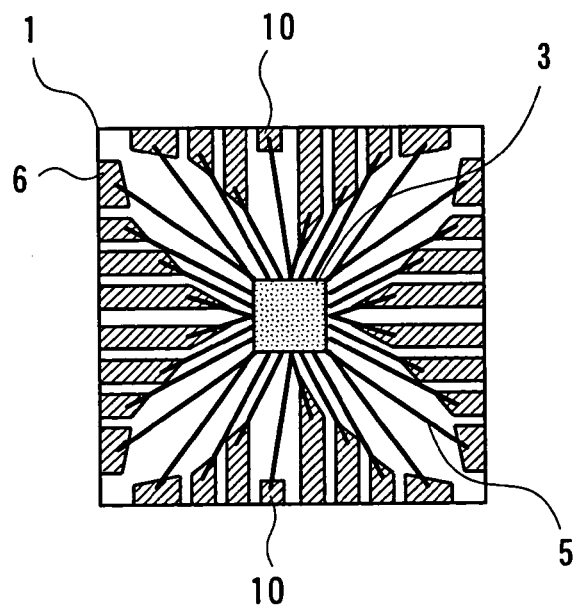
FIG. 12 is a layout diagram of a molded semiconductor package according to the first embodiment, in which the length of particular inner lead frames are intentionally reduced to increase the length of the wires connected to them.

FIG. 12 is a layout diagram of still another molded semiconductor package, in which the length of particular inner lead frames are intentionally reduced to increase the length of the wires connected to them.

In FIG. 12, reference numeral 1 denotes a lead frame; 3, an LSI; 5, wires connected between the LSI 3 and inner lead frames; 6, inner lead frames extended into close proximity to the LSI 3; and 10, inner lead frames whose length is intentionally reduced to reduce the length of its inner lead.

Figure 13:
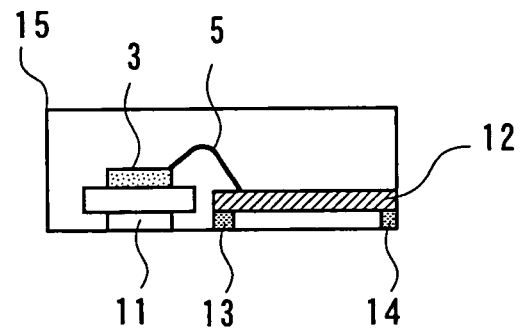
FIG. 13 is a layout diagram of a molded semiconductor package according to the first embodiment, as viewed from the side.

FIG. 13 is a layout diagram of a molded semiconductor package, showing a lead frame, wires, and a mounted LSI as viewed from the side.

In FIG. 13, reference numeral 3 denotes the LSI; 5, a wire connected between the LSI 3 and an inner lead frame; 11, a stage on which the LSI 3 is placed; 12, the inner lead frame having an inner lead thereon supported at two points like a bridge; 13, an electrode (or a support as a supporting member) of the inner lead frame 12 disposed close to the LSI 3; 14, an electrode (or a support as a supporting member) of the inner lead frame 12 disposed close to the periphery of the package so as to be opposed to the electrode 13; and 15, the molded package.

Figure 14:
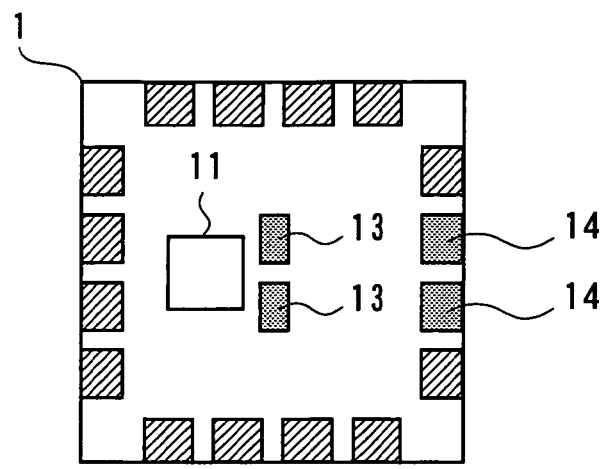
FIG. 14 is a layout diagram of a molded semiconductor package shown in FIG. 13, as viewed from the bottom surface.

FIG. 14 is another layout diagram of the molded semiconductor package shown in FIG. 13, showing the lead frame, wires, and the mounted LSI as viewed from the bottom surface.

In FIG. 14, reference numeral 1 denotes the lead frame; 11, a stage on which the LSI is placed; 13, electrodes (or supports) of inner lead frames disposed close to the LSI; and 14, electrodes (or supports) of the inner lead frames disposed close to the periphery of the package.

Figure 15:
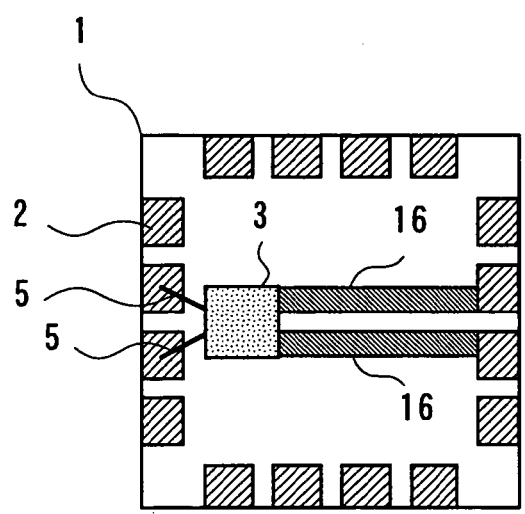
FIG. 15 is a layout diagram of a molded semiconductor device according to the first embodiment, as viewed from the top surface.

FIG. 15 is a layout diagram of still another molded semiconductor device, showing a lead frame, wires, and a mounted LSI as viewed from the top surface.

In FIG. 15, reference numeral 1 denotes the lead frame; 2, inner lead frames; 3, an LSI; 5, wires connected between the LSI 3 and the inner lead frames 2; and 16, GSG (ground-signal-ground) flexible substrates (flexible printed substrates).

FIGS. 16 to 21 are layout diagrams of molded semiconductor devices, each showing a lead frame, wires, and mounted LSIs as viewed from the side.

Figure 16:
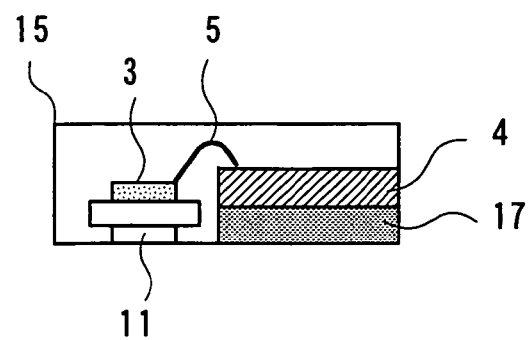
FIG. 16 is a layout diagram of a molded semiconductor device according to the first embodiment, as viewed from the side.

In FIG. 16, reference numeral 3 denotes an LSI; 4, inner lead frames extended into closer proximity to the LSI 3 than other inner lead frames; 5, a wire connected between the LSI 3 and one of the inner lead frames 4; 11, a stage on which the LSI 3 is placed; 15, the molded package; and 17, an electrode (or a seat as a supporting member) disposed under the inner lead frames 4.

Figure 17:
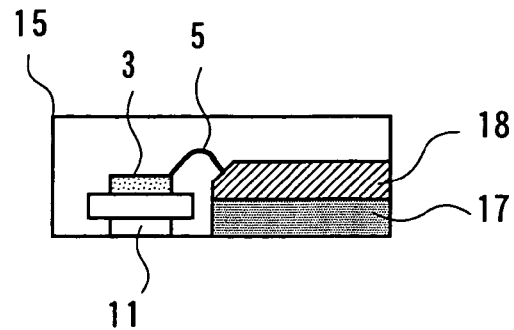
FIG. 17 is a layout diagram of a molded semiconductor device according to the first embodiment, as viewed from the side.

In FIG. 17, reference numeral 3 denotes an LSI; 5, the wire connected between the LSI 3 and the inner lead frame 18; 11, a stage on which the LSI 3 is placed; 15, the molded package; 17, an electrode (or a seat as a supporting member) disposed under inner lead frame 18; and 18, an inner lead frame extended into closer proximity to the LSI 3 than other inner lead frames and having a sloping surface to which one of the wires 5 is bonded.

Figure 18:
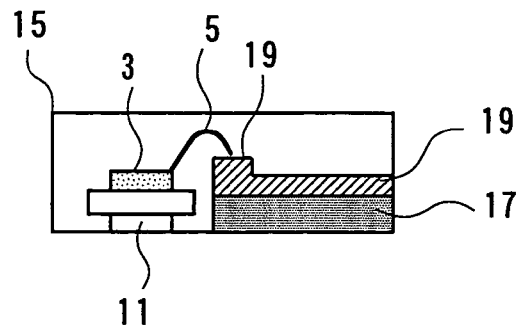
FIG. 18 is a layout diagram of a molded semiconductor device according to the first embodiment, as viewed from the side.

In FIG. 18, reference numeral 3 denotes an LSI; 5, a wire connected between the LSI 3 and an inner lead frame; 11, a stage on which the LSI 3 is placed; 15, the molded package; 17, an electrode (or a seat as a supporting member) disposed under an inner lead frame 19; and 19, the inner lead frame having an elevated bonding surface toward the highest point of arch-shaped wires to which one of the wires 5 is bonded.

Figure 19:
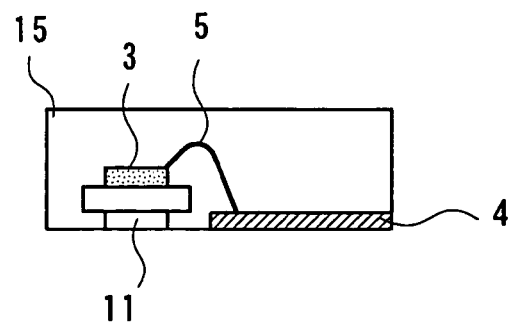
FIG. 19 is a layout diagram of a molded semiconductor device according to the first embodiment, as viewed from the side.

In FIG. 19, reference numeral 3 denotes an LSI; 4, an inner lead frame extended into closer proximity to the LSI 3 than other inner lead frames; 5, a wire connected between the LSI 3 and the inner lead frame 4; 11, a stage on which the LSI 3 is placed; and 15, the molded package.

Figure 20:
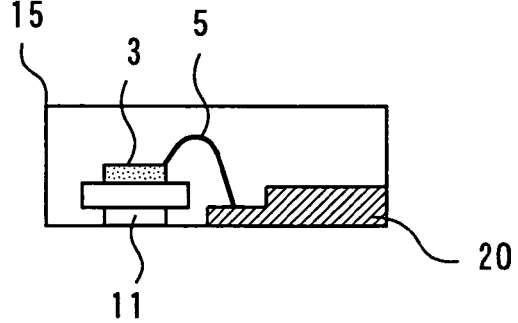
FIG. 20 is a layout diagram of a molded semiconductor device according to the first embodiment, as viewed from the side.

In FIG. 20, reference numeral 3 denotes an LSI; 5, a wire connected between the LSI 3 and an inner lead frame; 11, a stage on which the LSI 3 is placed; 15, the molded package; and 20, an inner lead frame having a lowered bonding surface to which wire 5 is bonded.

Figure 21:
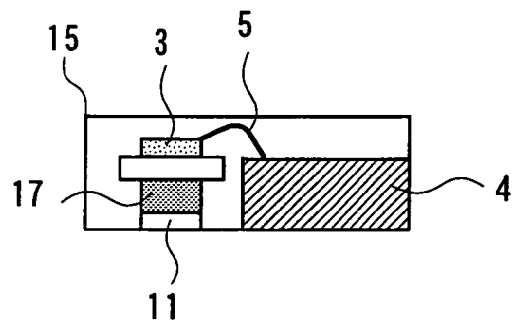
FIG. 21 is a layout diagram of a molded semiconductor device according to the first embodiment, as viewed from the side.

In FIG. 21, reference numeral 3 denotes an LSI; 4, an inner lead frame extended into closer proximity to the LSI 3 than other inner lead frames; 5, a wire connected between the LSI 3 and the inner lead frame 4; 11, a stage on which the LSI 3 is placed; 15, the molded package; and 17, a seat (or a supporting member) for elevating the mounted position of the LSI 3.

Figure 22A:
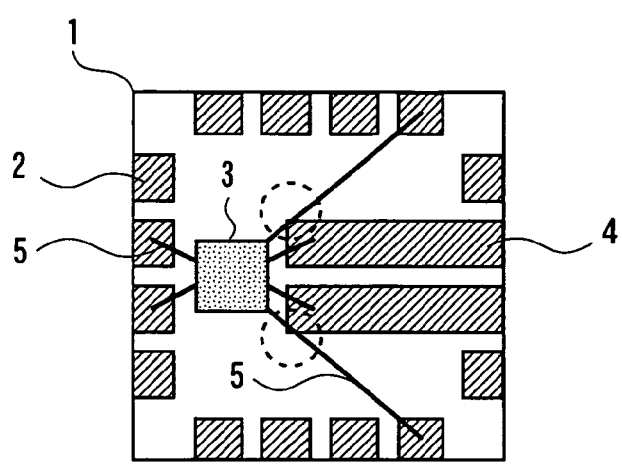
FIGS. 22A and 22B show a diagram illustrating how to densely arrange wires according to the first embodiment.
Figure 22B:
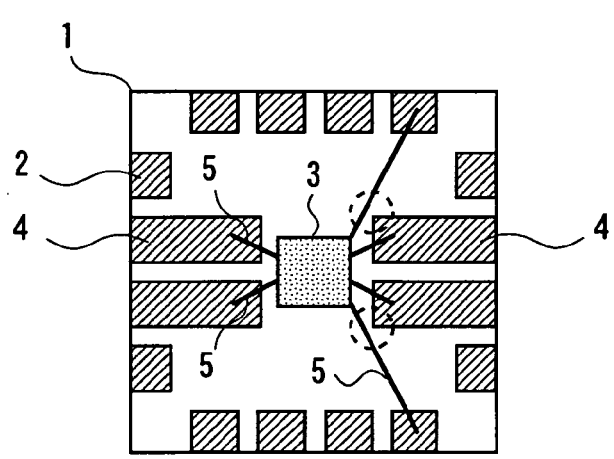

FIGS. 22A and 22B are diagrams illustrating how to densely arrange wires.

In FIGS. 22A and 22B, reference numeral 1 denotes a lead frame; 2, inner lead frames; 3, an LSI; 4, inner lead frames extended into close proximity to the LSI 3; and 5, wires connected between the LSI 3 and the inner lead frames 4.

Figure 23:
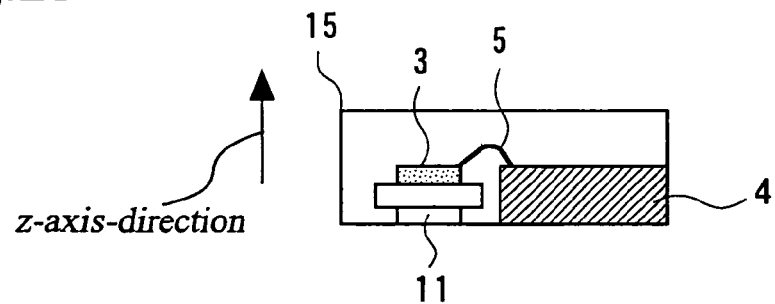
FIG. 23 is a layout diagram of a molded semiconductor device according to the first embodiment, as viewed from the side.

FIG. 23 is a layout diagram of a molded semiconductor device, showing a lead frame, a wire, and a mounted LSI as viewed from the side. This figure illustrates the positional relationship between the wire and the lead frame in the height direction. (The height direction coincides with the Z-axis direction.)

In FIG. 23, reference numeral 3 denotes the LSI; 4, an inner lead frame extended into closer proximity to the LSI 3; 5, the wire connected between the LSI 3 and the inner lead frame 4; 11, a stage on which the LSI is placed; and 15, the molded package.

The features and advantages of the first embodiment may be summarized as follows: the length of the wires is reduced to reduce their inductive components; the wires are densely arranged to allow the pin count to be increased; the shape of the lead frame allows the wire for each terminal to have appropriate length; the components are designed to help provide a low-cost common package configuration; and some wires can be eliminated to satisfy higher frequency requirements.

The effects and operation of the first embodiment of the present invention will now be described. In high frequency LSI for optical communications, etc., the inductive components of the wires connected to the high-speed data input and output terminals cause the frequency band of the circuitry to be degraded, which greatly affects their RF characteristics, such as input sensitivity and output waveform. To address this problem, the present embodiment provides inner lead frames having a configuration that allows the length of the wires connected to them to be reduced, as well as allows these wires to be densely arranged.

FIG. 1 shows a technique for minimizing the length of the wires connected to pads on opposing sides of the LSI 3.

Specifically, the inner lead frames 4 on the right side of the package as viewed in FIG. 1 are extended into close proximity to the LSI 3 so as to minimize the length of the wires. This allows the length of the wires 5 connected between the inner lead frames 4 and the LSI 3 to be reduced.

Further, since the LSI 3 is disposed close to the lead frames 2, the length of the wires 5 connected between the inner lead frames 2 and the LSI 3 are also shortened (on the left side as shown in FIG. 1). The configuration described in FIG. 1 allows reducing the length of the wires and hence the inductive components. This technique allows reducing the length of the wires even when a small LSI 3 is mounted in a large package.

FIG. 2 shows another technique for minimizing the length of the wires connected to pads on opposing sides of the LSI 3.

In FIG. 1, only inner lead frames 4 on one side are extended to reduce the length of the wire without extending inner lead frames 2 on the opposite side. On the other hand, according to the technique shown in FIG. 2, the LSI 3 is disposed at the center of the package, and the inner lead frames 4 on both sides (the right side and the left side) are extended into close proximity to the LSI 3 to reduce the wire length as viewed in FIG. 2, thereby achieving the same effect as the technique of FIG. 1. Furthermore, the configuration shown in FIG. 2 allows the density of wires on the upper and lower sides of the LSI 3 (as viewed in FIG. 2) to be increased, as compared to the configuration shown in FIG. 1. FIGS. 22A and 22B together show how the density of the wires on the upper and lower sides increases. In the configuration of FIG. 1, the rightmost pads on the upper and lower sides of the LSI 3 as viewed in the figure usually cannot be connected to the LSI by wires 5, since these wires 5 intersect the inner lead frames 4 if they are laid in a straight line between the LSI 3 and the right most pads, as shown in FIG. 22A. The configuration of FIG. 2, on the other hand, allows these pads on the LSI 3 to be connected to inner lead frames, as shown in FIG. 22B. Even in the configuration of FIG. 1, the pads can be connected to inner lead frames by wires 5, if wires 5 and the inner lead frames 4 are disposed at different heights (in z-axis direction). However, such an arrangement might cause a misunderstanding that there is an inner lead for a different node under these wires 5, resulting in an erroneous bonding operation. Preventing this from occurring requires high process accuracy. See FIG. 23. On the other hand, in the configuration shown in FIG. 2, wires can easily be connected between all pads on the LSI 3 and the inner lead frames, since the LSI 3 is located at the center of the package.

In FIGS. 1 and 2, a pair or pairs of inner lead frames 4 are extended into close proximity to the LSI 3 for a differential signal (a differential mode). In FIG. 3, on the other hand, only a single inner lead frame 4 is extended, assuming that a single-phase input and output signal is handled. This arrangement not only allows the wire length to be reduced but also provides space on both sides of the extended inner lead frame (the upper and lower sides as viewed in FIG. 3)., enabling wires to be densely arranged.

In FIG. 4, the leading ends, close to the LSI 3, of the extended inner lead frames 6 are chamfered. If they are not chamfered, wires 5 cannot be laid in a straight line to connect between the LSI 3 and the inner lead frames at corners of the package, or their installation space is restricted (see FIG. 4). That is, the angle of wires bonded to the four corners of the package is restricted. With the chamfered inner lead frames 6, each of the wires 5 can be prevented from intersecting the inner lead frames 6 for other nodes, allowing the higher accuracy in bonding and assembly than the conventional method to be relaxed. This results in low cost. Furthermore, even the pads at the four corners can be used, allowing the density of wires (or pads) to be increased.

FIG. 5 shows an extended inner lead frame 7 in which the leading end is chamfered at an acute angle to produce a pointed tip, resulting in a tapered width of inner lead frame 7, which allows the wires to be more densely arranged.

FIG. 6 shows an extended inner lead frame 8 in which only a portion of the leading end is chamfered. This inner lead frame may be used when the wires need not be arranged very densely.

FIG. 7 is a configuration as viewed from the top surface in which the wires and the inner lead frames do not directly meet each other. In the example shown in FIG. 4, the leading end of each inner lead frame 6 is chamfered to allow the wires to be densely arranged. However, if the LSI 3 is located higher than the inner lead frames (the height direction coinciding with the z-axis direction in the figure), then there is less possibility of erroneous bonding since the wires descend from the LSI 3 to the inner lead frames. In this case, simple unchamfered rectangular inner lead frames 4 may be used, as shown in FIG. 7.

The configuration shown in FIG. 8 may be employed to reduce the length of the wires connected to all pads on the four sides of the LSI, as well as to increase the density of wires. In FIG. 8, the inner lead frames 6 on all four sides of the package are extended into close proximity to the LSI, and the leading ends of these inner lead frames 6 are chamfered.

The configuration shown in FIG. 9 may be employed to further increase the density of wires (and to allow wires to be laid between the LSI 3 and the inner lead frames 7 at the four corners). In FIG. 9, the inner lead frames 8 disposed at the center of the package have a reduced width. Further, the inner lead frames 7 at the four corners of the package have an increased width and hence an increased area. This allows wires to be easily bonded to the inner lead frames 7 at the four corners where the wires need to be handled in narrow space. Further, the frame size of the inner lead frames 7 at the four corners can be increased by reducing the frame width of the inner lead frames 8 that is in the middle of each four side, resulting in being able to further increasing the density of wires in the same package.

The configuration shown in FIG. 10 may be employed when it is necessary to reduce the length of the wires connected to the terminals at the four corners of the LSI 3. In FIG. 10, the inner lead frames 4 at the four corners of the package are made longer than other inner lead frames 4 at the center. This makes it possible to reduce the length of the wires connected to the terminals at the four corners as well as at the center of the LSI 3.

The configuration shown in FIG. 11 is a variation of the configuration shown in FIG. 10 and may be employed to further reduce the length of the wires connected to the terminals at the four corners of the LSI 3. The example shown in FIG. 11 employs curved inner lead frames 9, allowing the length of the wires connected to the terminals at the four corners of the LSI 3 to be further reduced, as compared to the rectangular inner lead frames shown in FIG. 10.

The configuration of the inner lead frame 10 shown in FIG. 12 may be employed when it is necessary to utilize the inductive components of the wires connected to some terminals while reducing the length of the wires connected to other terminals. This arrangement may be applied to the configuration shown in FIG. 9. That is, the inner lead frames 8 may be extended, and the length of particular inner lead frames 7 may be reduced to increase the length of the wires connected to them.

In the example shown in FIG. 13, supports are provided under both sides of the extended inner lead frame like a bridge. This allows a peripheral configuration having the extended inner lead frame to be incorporated into a package, as well as a peripheral configuration of a conventional symmetrical arrangement of inner lead frames. Although the supports 13, which constitute the same node as supports 14 shown in FIG. 14, are exposed at the package back surface by using the bridge-configuration, the peripheral nodes of the package are arranged in the same manner as conventional packages. On the other hand, if the extended inner lead frame 12 is exposed at the package back surface without the supports, the substrate must have a corresponding configuration to allow the package to be properly mounted thereon, resulting in reduced versatility, as compared to a conventional configuration having a symmetrical arrangement of peripheral nodes.

Further, if the extended inner lead frames 12 are supported by only the supports 14 attached to a side of the package without using the supports 13 disposed near the LSI, then the inner lead frames 12 may be shaken by a shock given when wire bonding is carried out, which greatly affects the bonding strength. The configuration shown in FIG. 13 allows only the terminals of the peripheral nodes of the package to be exposed while maintaining sufficient bonding strength. As a result, the back surface configuration is the same as that of conventional packages, resulting in easy mounting of the package. That is, the configuration shown in FIG. 13, in which supports are provided under the extended inner lead frames like a bridge, achieves increased bonding strength, as well as provides the same level of ease of packaging as conventional packages.

FIG. 14 shows the back surface of the package having the inner lead frames shown in FIG. 13. Although the supports 13 are provided within the package, the peripheral nodes of the package are arranged (symmetrically) in the same manner as conventional packages, resulting in easy mounting of the package.

The configuration shown in FIG. 15 may be employed to further reduce the inductive components of wires 5. In FIG. 15, GSG flexible substrates 16 (or flexible printed-substrates) are used for reducing the loss components caused by the inductive components, instead of reducing the length of wires 5. That is, the GSG flexible substrates connects the LSI 3 and the inner lead frames. Since the GSG flexible substrates 16 have better transmission characteristics than the wires 5, the inductance (the inductive components) can be reduced to a negligible level. Actually, the GSG flexible substrates 16 exhibit substantially no loss. Therefore, the distance between the LSI and the inner lead frames may be increased as necessary. It should be noted that the transmission impedance of the GSG flexible substrates must be set to an appropriate value depending on the combination of the molded package and the flexible substrates.

If the pads on the LSI and the inner lead frames wire-bonded to them are located at the same height (the z-axis direction), the bonding wires usually must be laid in an arch shape and hence have an increased length, as compared to the minimum length (the length in a straight line). To prevent this, in the configuration shown in FIG. 16 the seat 17 is provided under the inner lead frame 4 to elevate the bonding position toward the highest point of the wire on the inner lead frame 4. Thus, the configuration shown in FIG. 16, in which the seat 17 is inserted under the inner lead frame 4 to elevate the bonding position close to a highest position of the wires, allows the length of the bonding wire being laid in an arch shape to be reduced, as compared to the configuration in which the pads on the LSI 3 and the inner lead frame 4 are at the same height.

The configuration shown in FIG. 17 is a variation of the configuration shown in FIG. 16. In this example, a portion of the inner lead frame 18 is chamfered as shown in FIG. 17 to slope a wiring bonding surface to which one of the wires 5 is bonded. This allows the length of the wire connected to the wiring bonding surface to be reduced, as compared to the configuration shown in FIG. 16 in which the wire is bonded to an unchamfered horizontal surface.

The configuration shown in FIG. 18 is another variation of the configuration shown in FIG. 16. In this example, the inner lead frame 19 has an elevated wire bonding surface relatively higher than its top surface to further reduce the wire length, as compared to the example shown in FIG. 16.

On the other hand, the configuration shown in FIG. 19 may be employed when it is necessary to increase the length of the wires 5 connected to terminals and utilize their inductive components. In FIG. 19, the top surface of the inner lead frame 4 is relatively lower than the pads on the LSI 3. This arrangement allows the length of the wires 5 to be increased, thereby increasing its inductive components, as compared to the case where the pads on the LSI 3 and the inner lead frame 4 are located at the same height. Thus, the inductive components of the wire can be utilized.

The configuration shown in FIG. 20 is a variation of the configuration shown in FIG. 19. In this example, the configuration (height) of the wiring bonding portion of the inner lead frame 20 is the same as the inner lead frame 4 in FIG. 19. However, the other portion of the inner lead frame 20 is made thicker than that shown in FIG. 19, resulting in a configuration that the bonding portion is a relatively lower than the thicker portion, to increase the bonding strength and reliability.

The configuration shown in FIG. 21 achieves the same effect as the configuration shown in FIG. 16. In FIG. 16, the height of the inner lead frame 4 is adjusted to adjust the length of the wire connected between the LSI 3 and the inner lead frame 4. On the other hand, in FIG. 21, the height of the seat 17 for the LSI 3 is adjusted to adjust the wire length. The configuration of FIG. 21, in which the seat 17 is disposed under the LSI 3, allows the bonding positions on the LSI 3 to be elevated toward the highest point of the wires, thereby allowing the length of wires 5 being laid in an arch shape to be reduced. Thus, by inserting the seat 17 under the LSI 3, it is possible to elevate the bonding positions on the LSI 3 and thereby reduce the wire length, as compared to the case where the pads on the LSI 3 and the inner lead frame 4 are at the same height, achieving the same effect as the configuration shown in FIG. 16.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-278308, filed on Sep. 26, 2005 including specification, claims, drawings and summary, on which the Convention priority of the present application is based, are incorporated herein by reference in its entirety.

What is claimed is:

1. A molded semiconductor package comprising:
   a semiconductor chip having a plurality of sides including opposed first and second sides and opposed third and fourth sides;
   a lead frame on which said semiconductor chip is mounted, the lead frame having
      a center,
      a plurality of edges corresponding to respective sides of the semiconductor chip, including first, second, third, and fourth edges, respectively opposite the first, second, third, and fourth sides of the semiconductor chip,
      a chip mounting region on which the semiconductor chip is mounted and which is offset from the center,
      a plurality of first inner leads located along the first edge of the lead frame and extending a first distance from the first edge of the lead frame toward the first side of the semiconductor chip,
      a plurality of second inner leads located along the second edge of the lead frame and extending a second distance from the second edge of the lead frame toward the second side of the semiconductor chip, and
      a plurality of third and fourth inner leads respectively located at the third and fourth edges of the lead frame; and
   a plurality of connecting members electrically connecting respective ends of the first and second inner leads, to the semiconductor chip, only at the first and second sides of the semiconductor chip, respectively, wherein the first distance is longer than the second distance.

2. The molded semiconductor package according to claim 1, wherein a third distance measured between the first side of the semiconductor chip and an end of an inner lead extending from the first edge of the lead frame that is close to a middle of the first side of the semiconductor chip is shorter than a fourth distance measured between the first side of the semiconductor chip and an end of an inner lead extending from the first edge of the lead frame that is closer to a corner of the first side of the semiconductor chip than to the middle of the first side of the semiconductor chip.

3. The molded semiconductor package according to claim 1, wherein at least one of the inner leads extending from the first edge of the lead frame toward the first side of the semiconductor chip has a tapered width tapering towards the first side of the semiconductor chip.

4. The molded semiconductor package according to claim 1, wherein each end of each of the inner leads has a tapered width tapering towards one of the sides of the semiconductor chip, and the ends of the inner leads closest to a middle of each of the sides of the semiconductor chip is closer to the respective side of the semiconductor chip than other inner leads at the respective side of the semiconductor chip.

5. The molded semiconductor package according to claim 1, wherein width of the inner lead connected proximate a middle of the first side of the semiconductor chip is smaller than widths of other inner leads connected to the first side of the semiconductor chip.

6. The molded semiconductor package according to claim 1, wherein a third distance measured between the first side of the semiconductor chip and an end of an inner lead connected with the first side of the semiconductor chip proximate a middle of the first side is larger than a fourth distance measured between the first side of the semiconductor chip and an end of an inner lead connected with the first side of the semiconductor chip that is closer to a corner of the first side than to the middle of the first side of the semiconductor chip, and the inner lead closer to the corner bends toward the middle of the first side.

7. The molded semiconductor package according to claim 1, wherein at least one of the connecting members is a wire, and at least one of the connecting members is a flexible printed-substrate.

8. The molded semiconductor package according to claim 1, wherein
the connecting members are wires,
each one of the wires connects a surface of the semiconductor chip to a surface of one of the inner leads and has an arched shape,
highest points of each of the wires relative to the surface of the semiconductor chip are substantially the same, and
the surfaces of the inner leads are not co-planar, and including a supporting member on an opposing surface opposite the surface of the inner lead contacted by the wire.

9. The molded semiconductor package according to claim 1, wherein
the connecting members are wires,
each one of the wires connects a surface of the semiconductor chip to a surface of one of the inner leads and has an arched shape,
highest points of each of the wires relative to the surface of the semiconductor chip are substantially the same, and
at least one of the inner leads has a sloping surface to which one of the wires is connected.

10. The molded semiconductor package according to claim 1, wherein
the connecting members are wires,
each one of the wires connects a surface of the semiconductor chip to a surface of one of the inner leads and has an arched shape,
highest points of each of the wires relative to the surface of the semiconductor chip are substantially the same,
the lead frame has a top surface on which the inner leads are arranged,
a first of the inner leads has a relatively higher surface and a relatively lower surface, relative to the top surface of the lead frame, and the relatively higher surface is closer to the first side of the semiconductor chip than the relatively lower surface, and
one of the wires is connected to the relatively higher surface.

11. The molded semiconductor package according to claim 1, wherein
the connecting members are wires,
each one of the wires connects a surface of the semiconductor chip to a surface of one of the inner leads and has an arched shape,
highest points of each of the wires relative to the surface of the semiconductor chip are substantially the same,
the lead frame has a top surface on which the inner leads are arranged,
a first of the inner leads has a relatively higher surface and a relatively lower surface, relative to the top surface of the lead frame, and the relatively lower surface is closer to the first side of the semiconductor chip than the relatively higher surface, and
one of the wires is connected to the relatively lower surface.

12. The molded semiconductor package according to claim 1, including a supporting member on a back surface side of the semiconductor chip, opposing a surface of the semiconductor chip to which the connecting member is connected.

13. The molded semiconductor package according to claim 1, wherein a third distance measured between the first side of the semiconductor chip and an end of an inner lead proximate a middle of the first side of the semiconductor chip is larger than a fourth distance measured between the first side of the semiconductor chip and an end of an inner lead that is closer to a corner of the first side of the semiconductor chip than to the middle of the first side of the semiconductor chip.

14. The molded semiconductor package according to claim 1, including first and second supporting members located on an opposing surface of the inner lead closest to the first side of the semiconductor chip, wherein
the first supporting member is located close to an end of the inner lead,
the second supporting member is located close to the edge of the lead frame, and
the second supporting member is an electrical conductor.

15. A molded semiconductor package comprising:
a semiconductor chip having a plurality of sides including opposed first and second sides and opposed third and fourth sides;
a package on which said semiconductor chip is mounted, the package having
a center,
a plurality of edges corresponding to respective sides of the semiconductor chip, including first, second, third, and fourth edges, respectively opposite the first, second, third, and fourth sides of the semiconductor chip,
a chip mounting region on which the semiconductor chip is mounted and which is offset from the center,
a plurality of first inner leads located along the first edge of the package and extending a first distance from the first edge of the package toward the first side of the semiconductor chip,
a plurality of second inner leads located along the second edge of the package and extending a second distance from the second edge of the package toward the second side of the semiconductor chip, and
a plurality of third and fourth inner leads respectively located at the third and fourth edges of the package; and
a plurality of connecting members electrically connecting respective ends of the first and second inner leads to the semiconductor chip, only at the first and second sides of the semiconductor chip, respectively, wherein the first distance is longer than the second distance.

16. A molded semiconductor package comprising:
a semiconductor chip having a plurality of sides including opposed first and second sides and opposed third and fourth sides;
a lead frame on which said semiconductor chip is mounted, the lead frame having
a plurality of edges corresponding to respective sides of the semiconductor chip, including first, second, third, and fourth edges respectively opposite the first, second, third, and fourth sides of the semiconductor chip,
a chip mounting region on which the semiconductor chip is mounted,
a plurality of first inner leads located alone the first edge of the lead frame and extending a first distance from the first edge of the lead frame toward the first side of the semiconductor chip,
a plurality of second inner leads located along the second edge of the lead frame and extending a second distance from the second edge of the lead frame toward the second side of the semiconductor chip, and
a plurality of third and fourth inner leads respectively located at the third and fourth edges of the lead frame; and
a plurality of first connecting members, each first connecting member having a first length, electrically connecting respective ends of the first inner leads, to the semiconductor chip, at the first side of the semiconductor chip; and a plurality of second connecting members, each second connecting member having a second length, longer than the first length, electrically connecting respective ends of the second inner leads to the semiconductor chip, at the second side of the semiconductor chip, wherein the first inner leads extending from the first edge of the lead frame toward the semiconductor chip provide high speed data input and/or output, the first distance is longer than the second distance, and at least one of the second connecting members is used as an inductor.

17. A molded semiconductor package comprising:

a semiconductor chip having a plurality of sides including opposed first and second sides and opposed third and fourth sides;

a package on which said semiconductor chip is mounted, the package having a plurality of edges corresponding to respective sides of the semiconductor chip, including first, second, third, and fourth edges, respectively opposite the first, second, third, and fourth sides of the semiconductor chip, a chip mounting region on which the semiconductor chip is mounted a plurality of first inner leads located along the first edge of the package and extending a first distance from the first edge of the package toward the first side of the semiconductor chip, a plurality of second inner leads located along the second edge of the package and extending a second distance from the second edge of the package toward the second side of the semiconductor chip, and a plurality of third and fourth inner leads respectively located at the third and fourth edges of the package; and a plurality of first connecting members, each first connecting member having a first length, electrically connecting respective ends of the first inner leads, to the semiconductor chip, at the first side of the semiconductor chip; and a plurality of second connecting members, each second connecting member having a second length, longer than the first length, electrically connecting respective ends of the second inner leads to the semiconductor chip, at the second side of the semiconductor chip, wherein the first inner leads extending from the first edge of the package provide high speed data input and/or output, the first distance is longer than the second distance, and at least one of the second connecting members is used as an inductor.

18. A molded semiconductor package comprising:

a semiconductor chip having a plurality of sides including opposed first and second sides and opposed third and fourth sides;

a lead frame on which said semiconductor chip is mounted, the lead frame having a plurality of edges corresponding to respective sides of the semiconductor chip, including first, second, third, and fourth edges, respectively opposite the first, second, third, and fourth sides of the semiconductor chip, a chip mounting region on which the semiconductor chip is mounted, a plurality of first inner leads located along the first edge of the lead frame and extending a first distance from the first edge of the lead frame toward the first side of the semiconductor chip, a plurality of second inner leads located along the second edge of the lead frame, a plurality of third inner leads located along the third edge of the lead frame and extending a second distance from the third edge of the lead frame toward the third side of the semiconductor chip, and a plurality of fourth inner leads located along the fourth edge of the lead frame; and a plurality of first connecting members, each first connecting member having a first length, electrically connecting respective ends of the first inner leads to the semiconductor chip at the first side of the semiconductor chip; and a plurality of second connecting members, each second connecting member having a second length, longer than the first length, electrically connecting respective ends of the third inner leads to the semiconductor chip at the third side of the semiconductor chip, wherein the first inner leads extending from the first edge of the lead frame toward the semiconductor chip provide high speed data input and/or output, the first distance is longer than the second distance, and at least one of the third connecting members is used as an inductor.

19. A molded semiconductor package comprising:

a semiconductor chip having a plurality of sides including opposed first and second sides and opposed third and fourth sides;

a package on which said semiconductor chip is mounted, the package having a plurality of edges corresponding to respective sides of the semiconductor chip, including first, second, third, and fourth edges, respectively opposite the first, second, third, and fourth sides of the semiconductor chip, the package having a chip mounting region on which the semiconductor chip is mounted a plurality of first inner leads located along the first edge of the package and extending a first distance from the first edge of the package toward the first side of the semiconductor chip, a plurality of second inner leads located along the second edge of the package, a plurality of third inner leads located at the third edge of the package, each third inner lead extending a second distance from the third edge of the lead frame toward the third side of the semiconductor chip, the second length being longer than the first length, and a plurality of fourth inner leads located along the fourth edge of the package; and a plurality of first connecting members, each first connecting member having a first length, electrically connecting respective ends of the first inner leads to the semiconductor chip at the first side of the semiconductor chip; and a plurality of second connecting members, each second connecting member having a second length, longer than the first length, electrically connecting respective ends of the third inner leads to the semiconductor chip at the third side of the semiconductor chip, wherein the first inner leads extending from the first edge of the package toward the semiconductor chip provide high speed data input and/or output, the first distance is longer than the second distance, and at least one of the third connecting members is used as an inductor.

* * * * *